(12) United States Patent
Henning (10) Patent No.: US 6,528,827 B2
(45) Date of Patent: Mar. 4, 2003

(54) MSM DEVICE AND METHOD OF MANUFACTURING SAME

(75) Inventor: Jason P. Henning, West Lafayette, IN (US)

(73) Assignee: OptoLynx, Inc., West Lafayette, IN (US)

(*) Notice: Subject to any disclaimer, the term of this patent is extended or adjusted under 35 U.S.C. 154(b) by 0 days.

(21) Appl. No.: 09/800,874

(22) Filed: Mar. 7, 2001

(65) Prior Publication Data

US 2002/0056853 A1 May 16, 2002

Related U.S. Application Data (60) Provisional application No. 60/247,114, filed on Nov. 10, 2000.

(51) Int. Cl.[7] .............................................. H01L 3/072
(52) U.S. Cl. .................... 257/187; 257/183.1; 257/184; 257/196; 257/233; 257/431; 257/464
(58) Field of Search .............................. 257/187, 183.1, 257/184, 196, 233, 431, 436, 449, 464, 631

(56) References Cited

U.S. PATENT DOCUMENTS

| | | |
|---|---|---|
| 4,127,860 A | 11/1978 | Beelitz et al. |
| 4,142,200 A | 2/1979 | Mizushima et al. |
| 4,616,241 A | 10/1986 | Biefeld et al. |
| 4,696,533 A | 9/1987 | Kingston et al. |
| 4,742,378 A | 5/1988 | Ito et al. |
| 4,807,006 A * | 2/1989 | Rogers et al ................. 357/30 |
| 4,821,093 A | 4/1989 | Iafrate et al. |
| 4,861,976 A | 8/1989 | Jewell et al. |
| 4,908,686 A | 3/1990 | Maserjian |
| 4,959,694 A | 9/1990 | Gell |
| 5,015,592 A | 5/1991 | Moldovan |
| 5,153,687 A | 10/1992 | Ishikawa et al. |
| 5,160,993 A | 11/1992 | Ishikawa et al. |
| 5,192,695 A | 3/1993 | Wang et al. |
| 5,216,538 A | 6/1993 | Twynam |
| 5,247,186 A | 9/1993 | Toda |
| 5,323,026 A | 6/1994 | Paoli |
| 5,332,918 A | 7/1994 | Smith et al. |
| 5,374,589 A | 12/1994 | Roush et al. |
| 5,386,126 A | 1/1995 | Henderson et al. |
| 5,391,869 A | 2/1995 | Ade et al. |
| 5,461,246 A | 10/1995 | Chou |
| 5,471,948 A | 12/1995 | Burroughes et al. |
| 5,479,539 A | 12/1995 | Goldsmith et al. |
| 5,508,829 A | 4/1996 | Freeouf et al. |
| 5,512,763 A * | 4/1996 | Allam .......................... 257/21 |
| 5,521,994 A | 5/1996 | Takeuchi et al. |
| 5,528,057 A | 6/1996 | Yanagase et al. |
| 5,565,978 A | 10/1996 | Okubo et al. |
| 5,598,062 A | 1/1997 | Iigami |
| 5,621,238 A | 4/1997 | Dodd et al. |
| 5,625,729 A | 4/1997 | Brown |
| 5,631,489 A | 5/1997 | Röser |
| 5,631,490 A * | 5/1997 | Dutta et al. ................. 257/457 |
| 5,637,862 A | 6/1997 | Paolella |
| 5,670,382 A | 9/1997 | Ishizuya et al. |
| 5,675,436 A | 10/1997 | Damen et al. |

(List continued on next page.)

FOREIGN PATENT DOCUMENTS

| | | | |
|---|---|---|---|
| JP | 62159477 A | * | 7/1987 |
| JP | 06188449 A | * | 7/1994 |

*Primary Examiner*—Nathan J. Flynn
*Assistant Examiner*—Remmon R. Fordé
(74) *Attorney, Agent, or Firm*—Maginot, Moore & Bowman (57) ABSTRACT

An MSM semiconductor circuit formed on a semi-insulating substrate that includes a set of contacts, first and second absorption layers, and a wide band gap buffer layer. The first absorption layer is formed on the semi-insulating substrate. The second absorption layer operably coupled to the set of contacts. The wide band gap buffer layer disposed between the first absorption layer and the second absorption layer.

14 Claims, 8 Drawing Sheets

U.S. PATENT DOCUMENTS

| | | |
|---|---|---|
| 5,679,965 A | 10/1997 | Schetzina |
| 5,815,615 A | 9/1998 | Taneya et al. |
| 5,837,617 A | 11/1998 | Oguri |
| 5,838,854 A | 11/1998 | Taneya et al. |
| 5,875,052 A | 2/1999 | Shmagin et al. |
| 5,956,362 A | 9/1999 | Yokogawa et al. |
| 6,025,950 A | 2/2000 | Tayebati et al. |
| 6,107,652 A * | 8/2000 | Scavennec et al. .......... 257/184 |
| 6,177,686 B1 * | 1/2001 | Gutierrez-Aitken .......... 257/22 |

* cited by examiner

MSM DEVICE AND METHOD OF MANUFACTURING SAME

This application claims the benefit of U.S. Provisional Patent Application Serial No. 60/247,114, filed Nov. 10, 2000, and which is incorporated herein by reference.

FIELD OF THE INVENTION

The present invention relates to semiconductors, and in particular, to metal semiconductor metal devices.

BACKGROUND OF THE INVENTION

Optical detectors are used in fiber optic communications to translate optical signals into electrical signals. While optical detectors have traditionally been constructed as PIN diodes, another family of optical detectors incorporate metal semiconductor metal ("MSM") technology. Detectors that incorporate MSM technology have certain advantages over PIN detectors. For example, MSM detectors exhibit less capacitance per unit area than PIN detectors. As a result, MSM detectors are more easily matched to the circuits in which they are used. In addition, MSM detectors are typically more easily fabricated.

Figure 1:
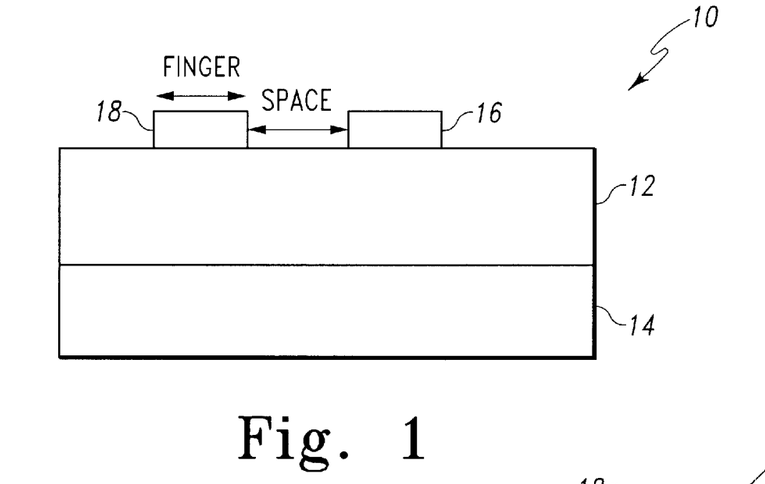
FIG. 1 shows a cross sectional schematic view of a prior art MSM device.
Figure 2:
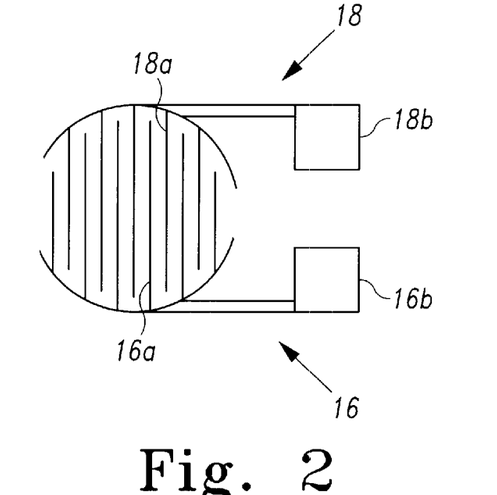
FIG. 2 shows a top view of the prior art MSM device of FIG. 1.
Figure 3:
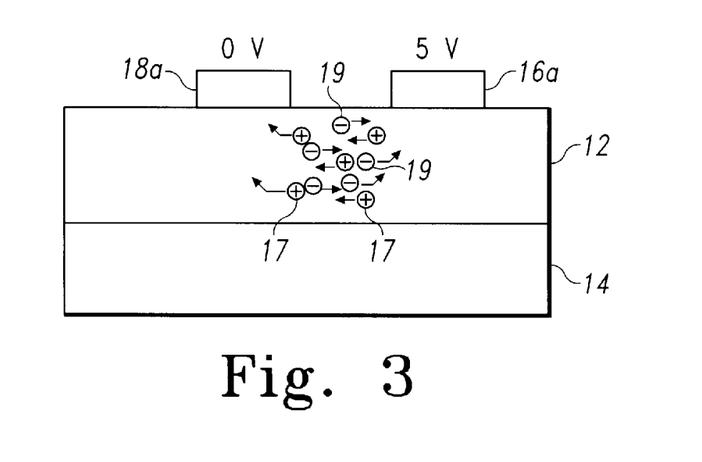
FIG. 3 shows a partial cross sectional schematic view of the prior art MSM device of FIG. 1 illustrating the carrier movement in the MSM device during use.
Figure 10:
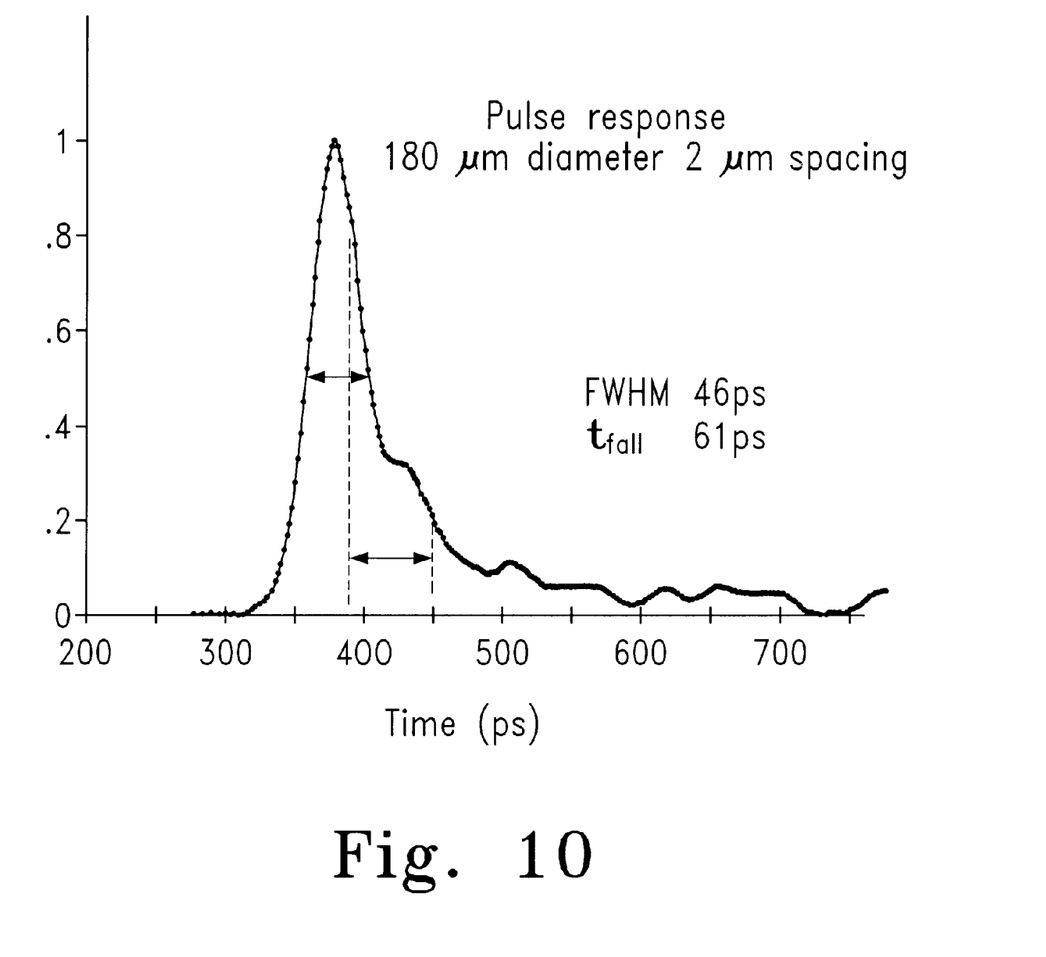
FIG. 10 shows a timing diagram of a pulse response of the modified version of the MSM device of FIG. 8 having the 0.5 micron absorption layer and 2 micron finger spacing.

A typical prior art MSM optical detector 10 is shown in FIGS. 1–3. FIGS. 1 and 3 show a cross-sectional, schematic-type view of the MSM optical detector 10 while FIG. 10 shows a top view. The prior art MSM optical detector 10 includes a GaAS absorption layer 12, a semi-insulating GaAs ("SI GaAs") substrate layer 14, and two electrical contacts 16, 18. As shown in FIG. 3, the electrical contact 16 and the electrical contact 18 are metal Schottky contacts that comprise a set of interdigitated fingers 16a and 18a, respectively, and terminate in a connector pad 16b and 18b, respectively.

FIG. 3 illustrates the operation of the detector in the presence of a light signal and a bias signal. In operation, a bias signal, typically 5 volts, is applied across the contacts 16 and 18 via the connector pads, not shown in FIG. 3. As light strikes the GaAs absorption layer 12, positive carriers 17 and negative carriers 19 are generated and are swept to respective contact fingers 16a and 18a by the field established by the bias signal. The use of interdigitated fingers as shown in FIG. 2 increases the number of concentrated fields established on the semiconductor.

One factor that limits the usefulness of MSM semiconductors is their operational speed limitations. These speed limitations arise in part from penetrating light. Deep penetrating light causes either the semi-insulating ("SI") substrate layer 14 or deep parts of the GaAs layer 12 to form carriers, referred to herein as deep carriers, that take a relatively long time to travel the contacts 16. As a result, electrical signal resulting from a light pulse may persist in a "decay tail" that effectively limits the useful speed of the detector.

Figure 4:
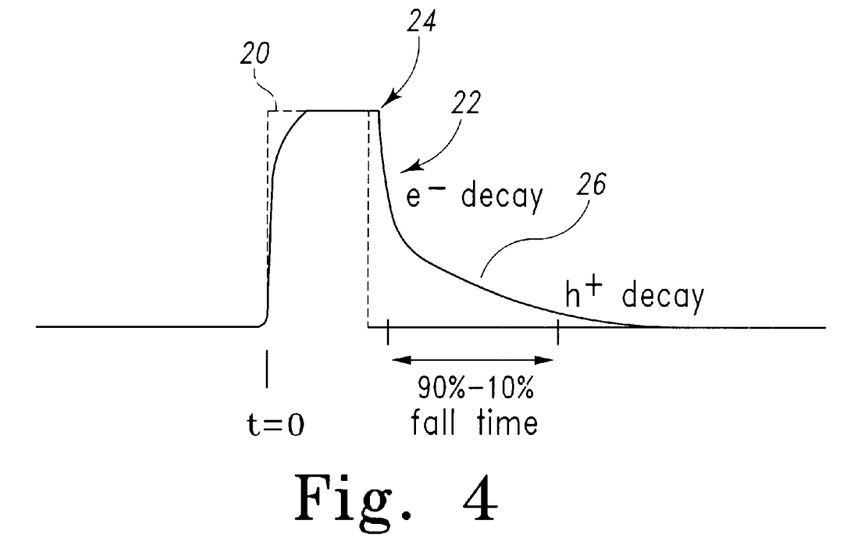
FIG. 4 shows a magnitude vs. time diagram illustrating the response characteristic of the MSM device of FIG. 1.

In particular, the response of a detector (such as the detector 10) may be measured in terms of rise and fall time in response to an applied light pulse. FIG. 4 shows a magnitude vs. time graph and includes an applied light pulse trace 20 and a typical device response trace 22. In general, the response trace 22 includes a primary response 24 and a decay tail 26. The positive carriers, or holes ($h^+$), which have less mobility than the negative carriers, or electrons ($e^-$), cause the decay tail. The deep $h^+$ carriers increase the decay tail 26 and thus slow down the effective response time of the device.

In order to increase the effective speed, U.S. Pat. No. 5,371,399 teaches a MSM detector that replaces the active GaAs layer 12 with a low temperature GaAs (LT GaAs) layer. The LT GaAs layer, due to its method of formulation, has relatively large "clumps" or precipitates of Arsenic within its crystalline structure. The presence of precipitates provides recombination sites for deep carriers. The recombination of the deep carriers within the semiconductor has the effect of shortening carrier lifetime, which in turn increases the speed of the device.

While the LT GaAs layer improves response time, it undesirably decreases sensitivity of the device because it eliminates the carriers that would otherwise produce the response current in the contacts.

Accordingly, there is a need for an MSM detector that has improved speed over the traditional prior art MSM detector and improved sensitivity over the MSM detector shown in U.S. Pat. No. 5,371,399.

SUMMARY OF THE INVENTION

The present invention address the above-stated need, as well as others, by providing a MSM device that employs a wide-band gap layer below the absorption layer. The wide band gap layer does not typically produce any carriers, but rather transmits the light through to deeper layers within the device. Any carriers generated below the wide band gap Al GaAs layer (form the transmitted light) are blocked from returning upward to the contacts by the wide band gap layer.

One embodiment of the present invention is an MSM semiconductor circuit formed on a semi-insulating substrate that includes a set of contacts, first and second absorption layers, and a wide band gap buffer layer. The first absorption layer is formed on the semi-insulating substrate. The second absorption layer operably coupled to the set of contacts. The wide band gap buffer layer disposed between the first absorption layer and the second absorption layer.

Another embodiment of the present invention is a method of forming such a circuit. The method includes a first step of growing a first absorption layer on a semi-insulating substrate. The second step comprises growing a wide band gap buffer layer on the first absorption layer. Thereafter, a second absorption layer is grown on the wide band gap buffer layer. In addition, contacts are operably coupled to the second absorption layer.

The use of the additional absorption layer (i.e. first absorption layer) between the wide band gap layer and the semi-insulating substrate layer facilitates the absorption of the light transmitted through the AlGaAs layer. This absorption layer may simply be a normal GaAs layer, or may be a low temperature or intermediate temperature type of GaAs.

Because the wide band gap buffer transmits lights to layers deep within the device and does not generately transmit carriers from such layers to the surface, the wide band gap buffer substantially inhibits deep carriers from adversely affecting the response time of the device. Accordingly, in contrast to the prior art, the structure of the present invention does not depend upon the use of LT GaAs in the active absorption layer to recombine carriers and thus does not exhibit corresponding loss in sensitivity.

The above-described features and advantages, as well as others, will become more readily apparent to those of ordinary skill in the art by reference to the following detailed description and accompanying drawings.

DESCRIPTION OF THE INVENTION

Figure 5:
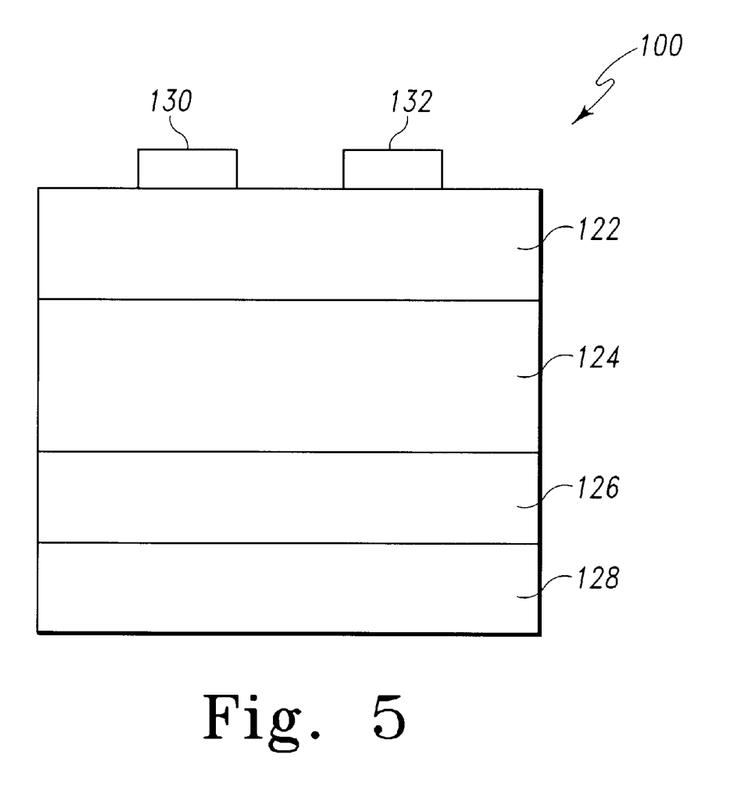
FIG. 5 shows a cross sectional schematic view of an exemplary MSM device according to the present invention.

FIG. 5 shows a preferred embodiment of an MSM device 100 according to the present invention. That device includes an absorption layer 122, preferably GaAs, a wide band gap buffer 124, preferably AlGaAs, an excess light absorption layer 126, a substrate 128, preferably SI GaAs, and contacts 130 and 132. The device may be integrated, of course, with other semiconductor layers to form more complex circuit. Moreover, as will be seen by the various examples of the present invention discussed below, additional layers may be added to provide additional beneficial effects.

In general, the when a bias voltage is across the contacts 130 and 132, the MSM device 100 generates current pulses in response to light pulses striking the surface of the MSM device and penetrating into the absorption layer 122.

In particular, light penetrates into the absorption layer 122, thereby causing the absorption layer to generate positive and negative carriers. The electric field set up by the bias voltage on the contacts 130 and 132 cause the negative carriers to migrate to one contact and the positive carriers to migrate to the other contact, thereby forming the response current.

Light that penetrates through the absorption layer 122 propagates through the wide band gap buffer 124. The wide band gap buffer 124 generates substantially no carriers and instead provides the deep penetrating light to the excess light absorption layer 126. The excess light absorption layer 126 absorbs the deep penetrating light. The carriers formed by the excess light absorption layer 126 do not migrate to the contacts 130 and 132 because the wide band gap buffer 124 blocks the migration. As will be discussed below, LT GaAs may be used as the excess light absorption layer 126, which provides locations for the carriers generated therein to recombine.

Figure 6:
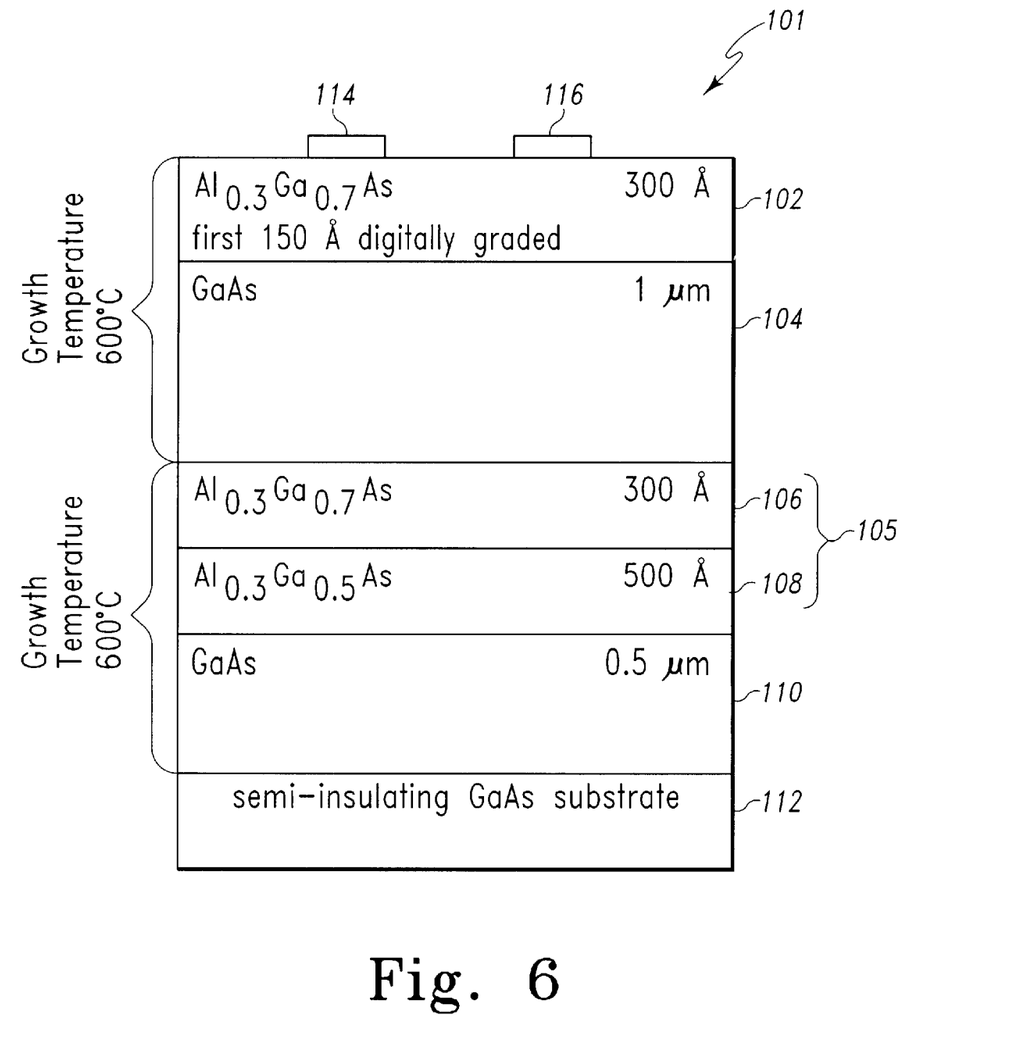
FIG. 6 shows a cross sectional schematic view of a first specific example of an MSM device according to the present invention.

FIG. 6 shows a cross sectional schematic of a first example of an MSM device 101 according to the present invention. In general, the MSM device 101 includes an absorption layer 104, a composite wide band gap buffer layer 105, an excess light absorption layer 110, and a semi-insulating substrate 112. The device 100 further includes Schottky contacts 114 and 116 which may suitably have the same arrangement as the contacts 16 and 18 of FIG. 2. The device 100 also includes an upper AlGaAs layer 102.

A sample of the MSM device 101 was fabricated. In fabricating the device, a 0.5 micron GaAs layer was grown onto the SI GaAs substrate 112 at a substrate temperature of 600° C. Suitable techniques for the growth of crystalline GaAs are known to those of ordinary skill in the art. The 0.5 micron GaAs layer formed the excess light absorption layer 110.

Thereafter, the wide band gap buffer layer 105 was formed as two separate sublayers 106 and 108. To this end, a first AlGaAs layer 108 formulated of $Al_{0.5}Ga_{0.5}As$ was grown at a substrate temperature of 600° C. to a thickness of 500 Angstroms. A second AlGaAs layer 106 formulated of $Al_{0.3}Ga_{0.7}As$ was grown at 600° C. to a thickness of 300 Angstroms.

The use of two different AlGaAs layers 106 and 108 as the wide band gap layer 105 provided a balance between the beneficial elements of AlGaAs and the detrimental effects of AlGaAs. The larger concentrations of Aluminum in AlGaAs provides better blocking of deep carriers. Accordingly, inclusion of the $Al_{0.5}Ga_{0.5}As$ layer 108 provides desirable carrier blocking. However, high concentrations of Aluminum in the AlGaAs can introduce crystal structure surface defects that can disrupt the crystal structure in the surrounding layers. Accordingly, the $Al_{0.3}Ga_{0.7}As$ layer 106 acts as a buffer between the high concentration Aluminum $Al_{0.3}Ga_{0.5}$ layer 108 and the critical active absorption layer 104. The lesser defects of the crystal of the buffer layer 106 facilitates growth of the absorption layer 104.

It will be noted, however, that at least some of the benefits of the present invention may be realized with only a single wide band gap buffer layer. Moreover, at least some of the benefits of the present invention may be realized using an AlGaAs layer having an Al concentration as low as 0.2.

Referring again to the example, after the wide band gap buffer layer 105 was completed, a 1 micron GaAs layer was grown at 600° C. That 1 micron GaAs layer formed the absorption layer 104. Thereafter, a 300 Angstrom upper AlGaAs layer 102 was grown onto the absorption layer 104, and thus was disposed between the absorption layer 104 and the contacts 114, 116. The upper AlGaAs layer 102, formulated as $Al_{0.3}Ga_{0.7}As$ was added to decrease so-called dark leakage that is associated with Schottky contacts. In the growth of the AlGaAs layer 102, the first 150 Angstroms were digitally graded.

Digital grading is used to ease the transition between the absorption GaAs layer 104 and the upper AlGaAs layer 102. In particular, digital grading involves a technique of interleaving thin layers of GaAs and AlGaAs in the 150 Angstrom transition region. Such techniques are known to those of ordinary skill in the art. The transition provided by digital grating facilitates the transport of carriers through the AlGaAs layer into the active absorption layer 104.

The contacts 114 and 116 were formed using lift-off, a lithography technique. In particular, photoresist was laid down on the surface of the upper AlGaAs layer 102 in a pattern that constituted the negative of the pattern to be formed by the contacts 114 and 116. Thereafter, the metal contact material was deposited on the entire upper surface of the MSM device 101, thereby covering the photoresist and the exposed portions of the upper AlGaAs layer 102. Once the metal contact material was applied, the surface of the MSM device 101 was washed with photoresist solvent that removed the photoresist and the metal attached thereto. The remaining metal formed the pattern of the contacts 114, 116.

The contacts 114 and 116 preferably have a finger spacing of between 1 micron and 3 microns. Finger spacing is the spacing between adjacent fingers (see contact fingers 16a and 18a of FIG. 2) of the Schottky contacts 114 and 116. As will discussed in further detail below, the strength of the electric field degenerates as the spacing of the fingers increases. A stronger electric field reduces the response time of the device because the generated carriers more rapidly migrate to the contacts 14 and 116 under greater electric fields. Accordingly, close finger spacing can increase the practical speed of the device. However, close finger spacing also contributes to shadowing (i.e. a reduction of light that reaches the semiconductor), thereby reducing the responsivity of the device.

In any event, while the device 101 of FIG. 6 exhibited the features of the invention, it was determined that the excess light absorption layer 110 located below the buffer layers 106 and 108 in FIG. 6 generated and retained a significant amount of carriers, which can adversely influence the electric field in the absorption layer 104. The field influence can degrade somewhat the response of the device. Accordingly, the example of FIG. 6 was found to be sub-optimal.

Figure 7:
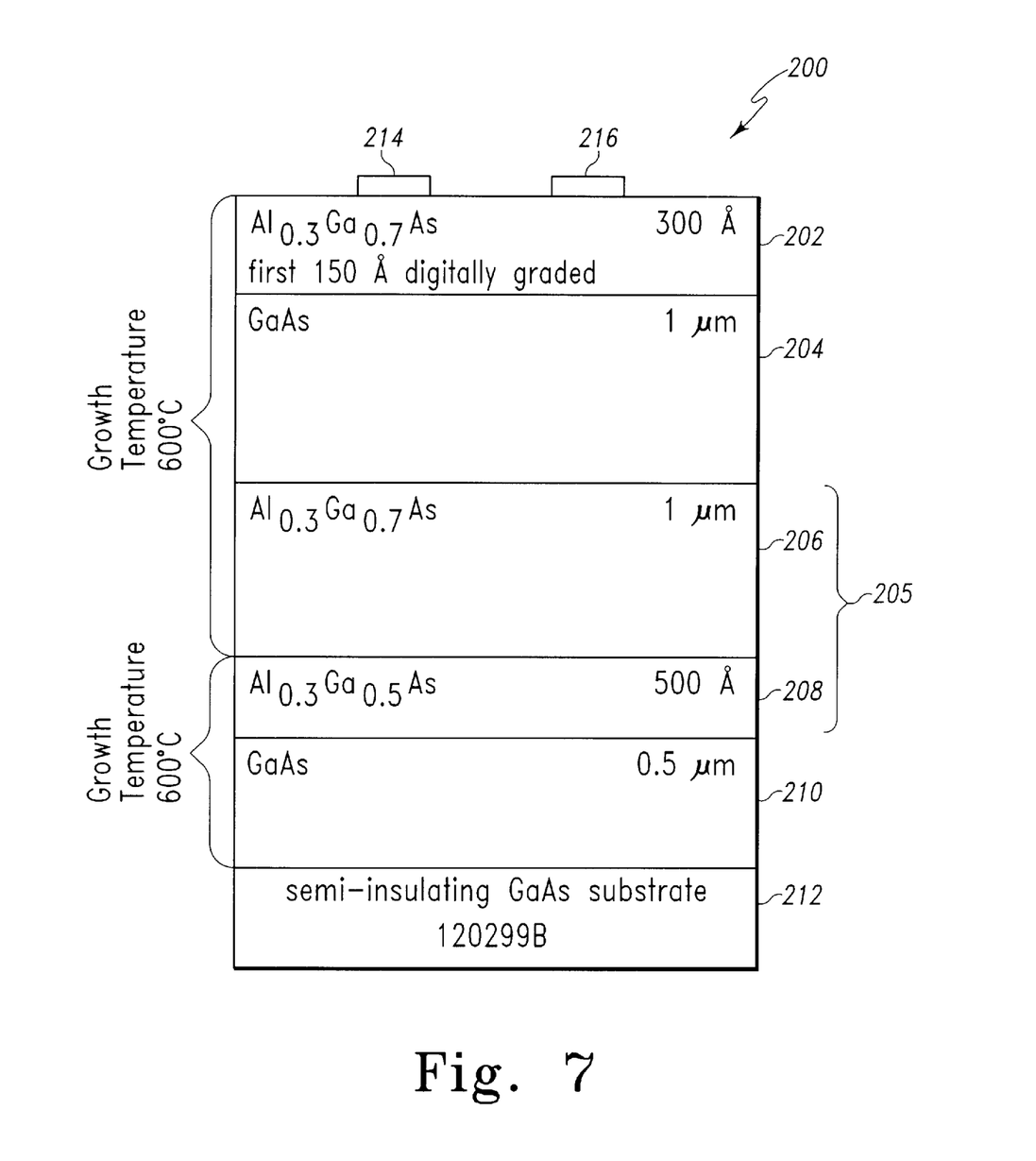
FIG. 7 shows a cross sectional schematic view of a second specific example of an MSM device according to the present invention.

In another variation of the MSM detector according to the present invention, the composite wide band gap layer was widened to counteract the effects of carrier retention in the excess light absorption. In particular, FIG. 7 shows a cross section schematic view of an MSM detector 200 in which the wide band gap layer was widened. This reduced the negative effect of the field caused by the deep carriers generated below the composite wide band gap layer.

In particular, the MSM detector 200, similar to the detector of FIG. 6, includes an absorption layer 204, a composite wide band gap buffer layer 205, an excess light absorption layer 210, a semi-insulating substrate 212, Schottky contacts 214 and 216, and an upper AlGaAs layer 202. The excess light absorption layer 210 is a 0.5 micron layer of GaAs grown at 600° C. The composite wide band gap buffer layer 205 includes a first AlGaAs layer 208 and a second AlGaAs layer 206. Similar to the AlGaAs layer 108 of FIG. 6, the AlGaAs layer 208 comprises a 500 Angstrom layer of $Al_{0.5}Ga_{0.5}As$ grown at 600° C. The second AlGaAs layer 206, however, comprises a much thicker layer of $Al_{0.3}Ga_{0.7}As$, for example, one micron thick, also grown at 600° C. The thicker layer of $Al_{0.3}Ga_{0.7}As$ helped address the electric field problems found in the example discussed above in connection with FIG. 6.

The absorption layer 204 and the upper AlGaAs layer 202 were grown in substantially the same manner as, respectively, the absorption layer 104 and the upper AlGaAs layer 102 of the MSM device 101 of FIG. 6, discussed above.

In yet another variation of the MSM detector, the problem of deep carriers generated below the wide band gap layer is addressed by inserting a precipitate layer, such as a low temperature ("LT") GaAs or intermediate temperature ("IT") GaAs layer as the excess light absorption layer between the buffer layer(s) and the semi-insulating substrate. The precipitate layer includes precipitates that serve as concentrated recombination sites for the generated carriers. The enhanced recombination of carriers in the precipitate layer reduces the number of carriers and thus reduces any field effect from deep carriers generated below the wide band gap layer(s).

Figure 8:
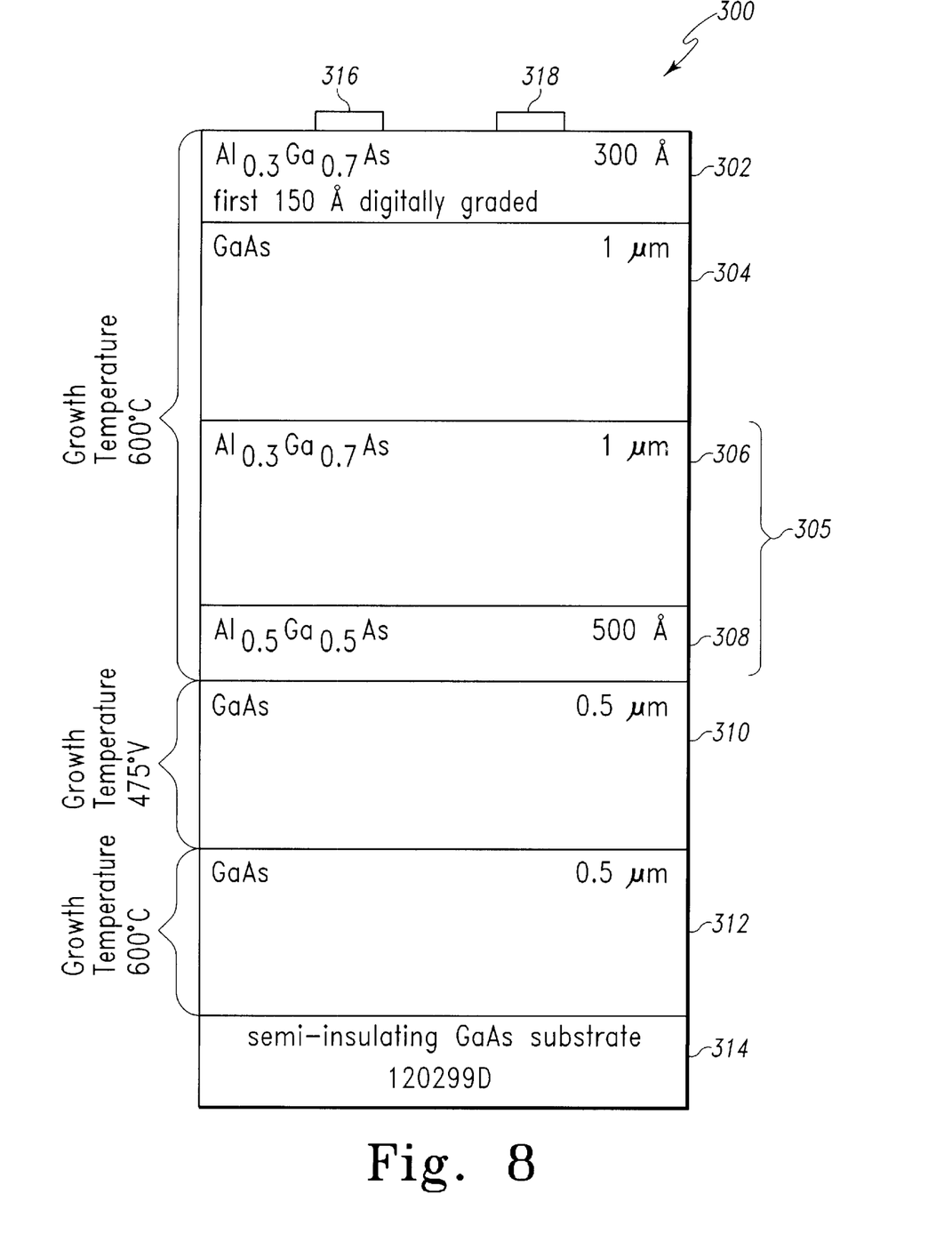
FIG. 8 shows a cross sectional schematic view of a third specific example of an MSM device according to the present invention.

FIG. 8 illustrates a cross sectional schematic view of an example of the preferred embodiment described above. In particular, FIG. 8 shows an MSM device 300 that includes a small upper AlGaAs layer 302, a main absorption layer 304, wide band gap buffer layer 305, an intermediate temperature GaAs excess light absorption layer 310, a transition layer 312, and a semi-insulating substrate 314. The MSM device 300 further includes contacts 316 and 318 which may suitably be the same or similar to those discussed above in connection with FIG. 2.

In forming the MSM device 300, the transition layer 312 is formed by growing a 0.5 micron GaAs layer onto the SI substrate 314 at a substrate temperature of 600° C. The transition layer 312 is included to cure any surface defects in the substrate 314 that were a result using a pre-grown and pre-packaged substrate. The transition layer 312 ensures that the surface upon which the IT GaAs excess light absorption layer 310 is grown has little or no crystal defects. For purposes of defining the invention herein, the transition layer 312 may be thought of as an extension of the SI substrate 314.

Thereafter, the excess light absorption layer 310 is formed by growing a 0.5 micron layer of IT GaAs, preferably at 475° C., onto the transition layer 312. It is noted that the excess light absorption layer 310 is shown as including IT GaAs grown at 475° C. The precipitate layer 310 may, however, suitably be IT GaAs grown at another temperature or LT GaAs. Lower temperature GaAs (grown at between 200° C. and 300° C.) in general has larger precipitates and thus causes shorter carrier life. Accordingly, lower temperature GaAs desirably further decreases the effects of fields generated by deep carriers generated below the wide band gap buffer. However, the larger precipitates can disrupt crystal growth in upper layers of the device and thus cause manufacturing problems. Accordingly, IT GaAs (grown at temperatures up to 500° C.) may be more optimal in some circumstances because the resultant smaller precipitates interfere less with the crystal growth.

Thereafter, a 500 Angstrom thick layer of $Al_{0.5}GA_{0.5}As$ is grown on the excess light absorption layer 310 as the first buffer layer 308. A 1 micron thick layer of $Al_{0.3}GA_{0.7}As$ is then grown on the first buffer layer 308 to form the second buffer layer 306. After completing the wide band gap buffer 305, the absorption layer 304 is added by growing a 1 micron thick layer of GaAs. Thereafter, a 300 Angstrom thick layer of $Al_{0.3}GA_{0.7}As$ is then grown on the absorption layer 304 to form the upper AlGaAs layer 302. The layers 302, 304, 306 and 308 may all suitably be grown at a substrate temperature of 600° C.

The contacts 314, 316 are then formed on the upper AlGaAs layer 302 using the lift-off technique described above.

Figure 9:
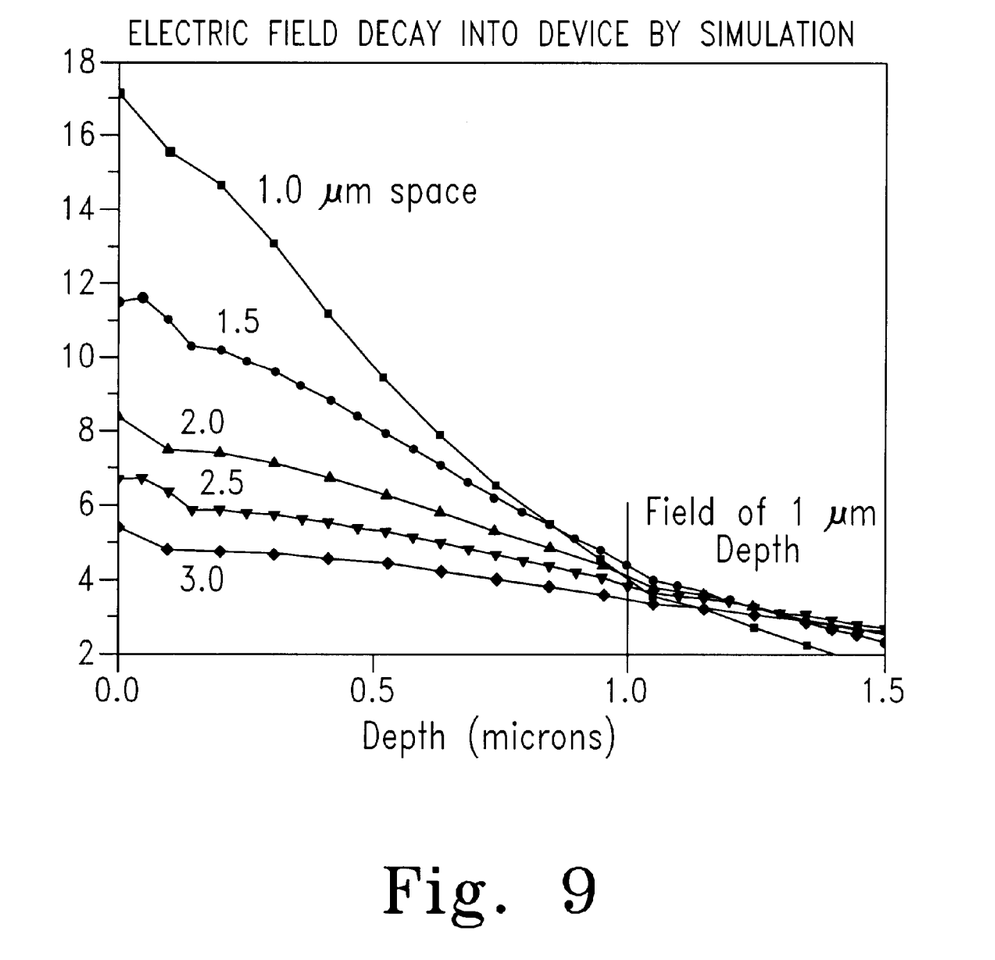
FIG. 9 shows a graph of simulated electric field strength within an absorption layer of an MSM device according to the invention as a function of both the depth of light penetration and the distance between the contacts.

A simulation was performed on the above described MSM device 300 in which the electric field strength was measured as a function of depth of light penetration into the absorption layer 304 and the finger spacing of the contacts 314, 316. The results of the simulation are shown in FIG. 9.

Indeed, it was also found that the electric field was greatly diminished at 1 micron, irrespective of finger spacing. Because the electric field was so diminished, the response time of the device suffered.

As a result, it may be preferable to form the MSM device 300 with a thinner absorption layer 304. In particular, an absorption layer 304 formed as a 0.5 micron layer of GaAs should provide greatly improved response time. However, some sensitivity is lost because less carriers are available to migrate to the contacts 314, 316. With such thickness, use of 1 micron finger spacing, and even 2 micron finger spacing provides a significant advantage over finger spacing of 3 microns. As between 1 micron finger spacing and 2 micron finger spacing, the 1 micron finger spacing provides a better response time, but also resulted in reduced sensitivity because of the "shadowing effects" associated with the close finger spacing. In one example, a MSM device having the construction of the MSM device 300 had 2 micron finger spacing, a 1 micron depth, and a three volt bias voltage and performed adequately at 5 gigaherz.

FIG. 10 shows a timing diagram of a pulse response of the modified version of the MSM device 300 having the 0.5 micron absorption layer 304 and 2 micron finger spacing in the contacts 314, 316. The finger width was 1 micron. The light pulse, a coherent light pulse having an 850 nm wavelength and a pulse width of 150 femptoseconds was applied at approximately the 310 ps point on the timing diagram. The full width half maximum (FWHM) was measured to be 46 picoseconds and the 80% to 20% fall time ($t_{fall}$) was measured to be 61 picoseconds.

Figure 11:
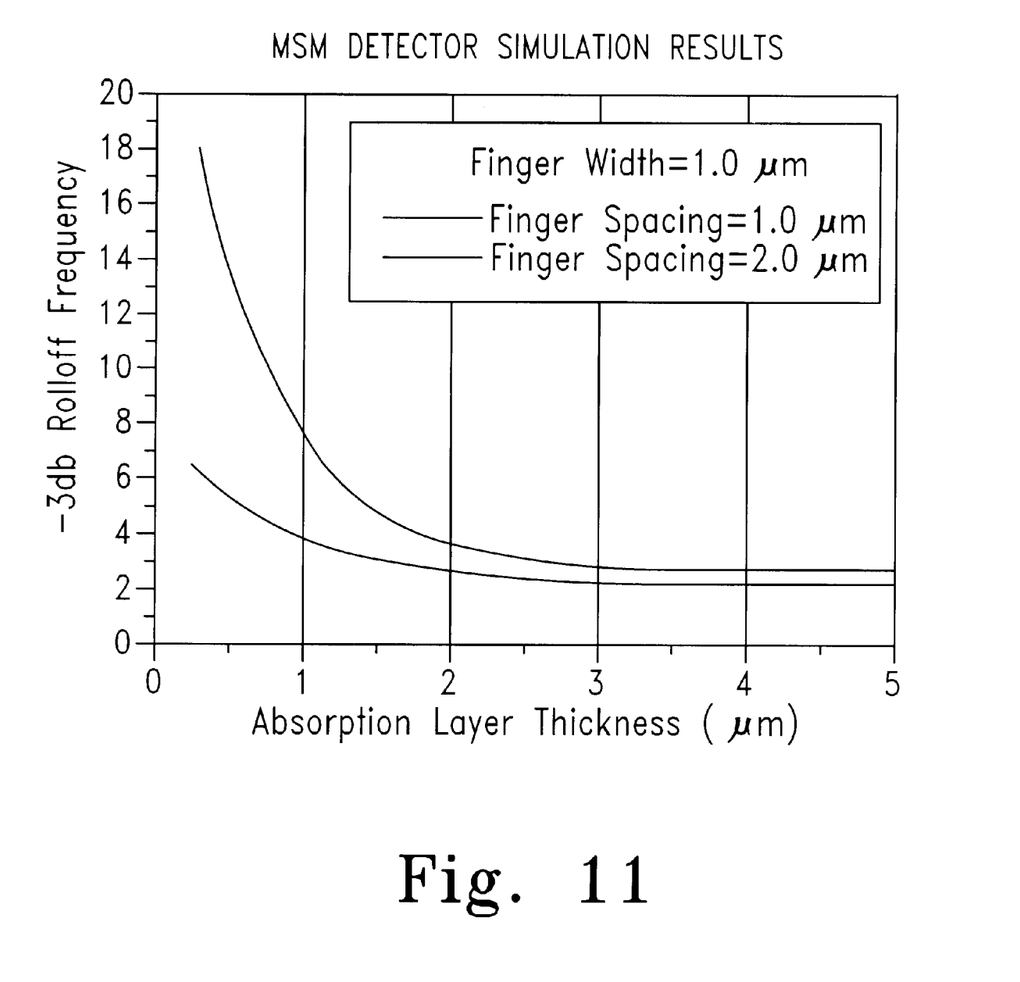
FIG. 11 shows a graph of the simulated −3 db cutoff frequency of the MSM device of FIG. 8 as a function of absorption layer thickness for two different finger spacing values.

A simulation was developed to determine the −3 db cutoff frequency of the MSM device 300 as a function of absorption layer thickness for two different finger spacing values. The results of the simulation are depicted in FIG. 11. The simulation was performed on Atlas simulation software available from Silvaco, of Santa Clara, Calif. The simulation assumed a 3.0 volt bias voltage. As can be seen from the simulation results in FIG. 11, the finger spacing and the absorption layer thickness may be selected to achieve the necessary frequency response. It is preferable to stay near the lowest acceptable −3 db cutoff frequency for each particular application to minimize the countervailing effects associated with reducing the finger spacing and the absorption layer thickness. As discussed above the countervailing effects include lack of sensitivity due to shadowing in the case of narrow finger spacing and reduced carrier availability in the case of reduced absorption layer thickness.

It will be appreciated that the above described embodiments are merely exemplary, and that those of ordinary skill in the art may readily devise their own implementations that incorporate the features of the present invention and fall within the spirit and scope thereof.

I claim:

1. A metal semiconductor metal (MSM) circuit formed on a semi-insulating substrate, the MSM circuit including:
   a first absorption layer formed on the semi-insulating substrate;
   a set of contacts;
   a second absorption layer operably coupled to the set of contacts; and
   a wide band gap buffer layer disposed between the first absorption layer and the second absorption layer.

2. The MSM circuit of claim 1 wherein the first absorption layer comprises GaAs.

3. The MSM circuit of claim 1 wherein the first absorption layer includes a low temperature GaAs.

4. The MSM circuit of claim 3 further comprising an interface layer interposed between the semi-insulating substrate and the first absorption layer.

5. The MSM circuit of claim 1 wherein the wide band gap buffer layer includes an AlGaAs layer.

6. The MSM circuit of claim 1 wherein the wide band gap buffer includes an AlGaAs layer having an Al concentration of between 0.2 and 0.5.

7. The MSM circuit of claim 1 wherein the wide band gap buffer includes a first AlGaAs layer having a first Al concentration and a second AlGaAs layer having a second Al concentration.

8. The MSM circuit of claim 7 wherein the first Al concentration exceeds the second Al concentration and wherein the second AlGaAs layer is disposed between the first AlGaAs layer and the second absorption layer.

9. The MSM circuit of claim 1 wherein the first absorption layer comprises an intermediate temperature GaAs.

10. The MSM circuit of claim 1 wherein an AlGaAs layer is interposed between the contacts and the second absorption layer.

11. The MSM circuit of claim 1 wherein the contacts comprise metal Schottky contacts.

12. The MSM circuit of claim 11 wherein the contacts have a finger spacing, and wherein the finger spacing is between 1 and 3 microns.

13. The MSM circuit of claim 1 wherein the second absorption layer comprises a 0.5 micron thick layer of GaAs.

14. A metal semiconductor metal (MSM) circuit formed on a semi-insulating substrate, the MSM semiconductor circuit including:
   a first absorption layer formed on the semi-insulating substrate;
   a set of contacts;
   a second absorption layer formed of GaAs operably coupled to the set of contacts; and
   a first wide band gap buffer layer of AlGaAs having a first Al concentration disposed between the first absorption layer and the second absorption layer; and
   a second wide band gap buffer layer of AlGaAs having a second Al concentration disposed between the second absorption layer and the first wide band gap buffer layer.

* * * * *